(12) United States Patent
Sakai et al.

(10) Patent No.: US 11,817,321 B2
(45) Date of Patent: Nov. 14, 2023

(54) PLASMA PROCESSING APPARATUS AND PLASMA PROCESSING METHOD

(71) Applicant: Tokyo Electron Limited, Tokyo (JP)

(72) Inventors: Yuzuru Sakai, Miyagi (JP); Ryo Terashima, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 93 days.

(21) Appl. No.: 17/450,886

(22) Filed: Oct. 14, 2021

(65) Prior Publication Data

US 2022/0122847 A1 Apr. 21, 2022

(30) Foreign Application Priority Data

Oct. 21, 2020 (JP) ................................. 2020-176954

(51) Int. Cl.
*H01L 21/311* (2006.01)
*H01J 37/32* (2006.01)
*H01L 21/67* (2006.01)
*H01L 21/687* (2006.01)

(52) U.S. Cl.
CPC .. *H01L 21/31116* (2013.01); *H01J 37/32449* (2013.01); *H01J 37/32834* (2013.01); *H01J 37/32899* (2013.01); *H01L 21/6719* (2013.01); *H01L 21/68771* (2013.01); *H01J 2237/3341* (2013.01)

(58) Field of Classification Search
CPC .......... H01L 21/31116; H01L 21/6719; H01L 21/68771; H01J 37/32449; H01J 37/32834; H01J 37/32899; H01J 2237/3341
See application file for complete search history.

(56) References Cited

U.S. PATENT DOCUMENTS

2013/0115781 A1* 5/2013 Matsumoto ....... H01L 21/32136
438/726
2022/0122847 A1* 4/2022 Sakai ................ H01L 21/31116

FOREIGN PATENT DOCUMENTS

CN 114256089 A * 3/2022 ......... C23C 16/4412
JP 2012182447 A * 9/2012 ............. H01L 29/04
JP 2019-102680 6/2019
JP 2022068031 A * 5/2022 ........ H01J 37/32449

* cited by examiner

*Primary Examiner* — Jeffrie R Lund
(74) *Attorney, Agent, or Firm* — IPUSA, PLLC (57) ABSTRACT

A plasma processing apparatus includes a plurality of plasma processing chambers, a process gas supply line that supplies a plasma processing gas to the plasma processing chambers, a first additive gas supply line that supplies an additive gas to the plasma processing chambers, an exhaust space shared by the plurality of plasma processing chambers, and a controller. The controller determines a first plasma processing chamber group and a second plasma processing chamber group. The first plasma processing chamber group includes one or more plasma processing chambers, each of which performs the plasma processing and the second plasma processing chamber group includes one or more plasma processing chambers, each of which does not perform the plasma processing. The controller causes the additive gas to be supplied to the one or more plasma processing chambers of the second plasma processing chamber group from the first additive gas supply line.

18 Claims, 6 Drawing Sheets

PLASMA PROCESSING APPARATUS AND PLASMA PROCESSING METHOD

CROSS-REFERENCE TO RELATED APPLICATIONS

This patent application is based on and claims priority to Japanese Patent Application No. 2020-176954 filed on Oct. 21, 2020, the entire contents of which are incorporated herein by reference.

TECHNICAL FIELD

The present disclosure relates to a plasma processing apparatus and a plasma processing method.

BACKGROUND

For example, Patent Document 1 proposes a batch type processing apparatus that can process multiple semiconductor wafers at the same time.

The present disclosure provides a plasma processing apparatus and a plasma processing method that can perform uniform substrate processing regardless of the number of substrates processed in multiple plasma processing chambers that share an exhaust space.

RELATED ART DOCUMENT

Patent Document

[Patent Document 1] Japanese Laid-open Patent Application Publication No. 2019-102680

SUMMARY

According to one aspect of the present disclosure, a plasma processing apparatus includes a plurality of plasma processing chambers, a process gas supply line configured to supply a plasma processing gas to each of the plurality of plasma processing chambers, a first additive gas supply line configured to supply an additive gas to each of the plurality of plasma processing chambers, an exhaust space shared by the plurality of plasma processing chambers, and a controller. The controller determines a first plasma processing chamber group and a second plasma processing chamber group. The first plasma processing chamber group includes one or more plasma processing chambers, each of which performs the plasma processing on a substrate, among the plurality of plasma processing chambers, and the second plasma processing chamber group includes one or more plasma processing chambers, each of which does not perform the plasma processing on a substrate, among the plurality of plasma processing chambers. The controller causes the additive gas to be supplied to the one or more plasma processing chambers of the second plasma processing chamber group from the first additive gas supply line.

DETAILED DESCRIPTION OF EMBODIMENTS

In the following, an embodiment for carrying out the present disclosure will be described with reference to the drawings. In each drawing, the same components are referenced by the same reference numerals and overlapping descriptions may be omitted.

[Plasma Processing Apparatus]

Figure 1:
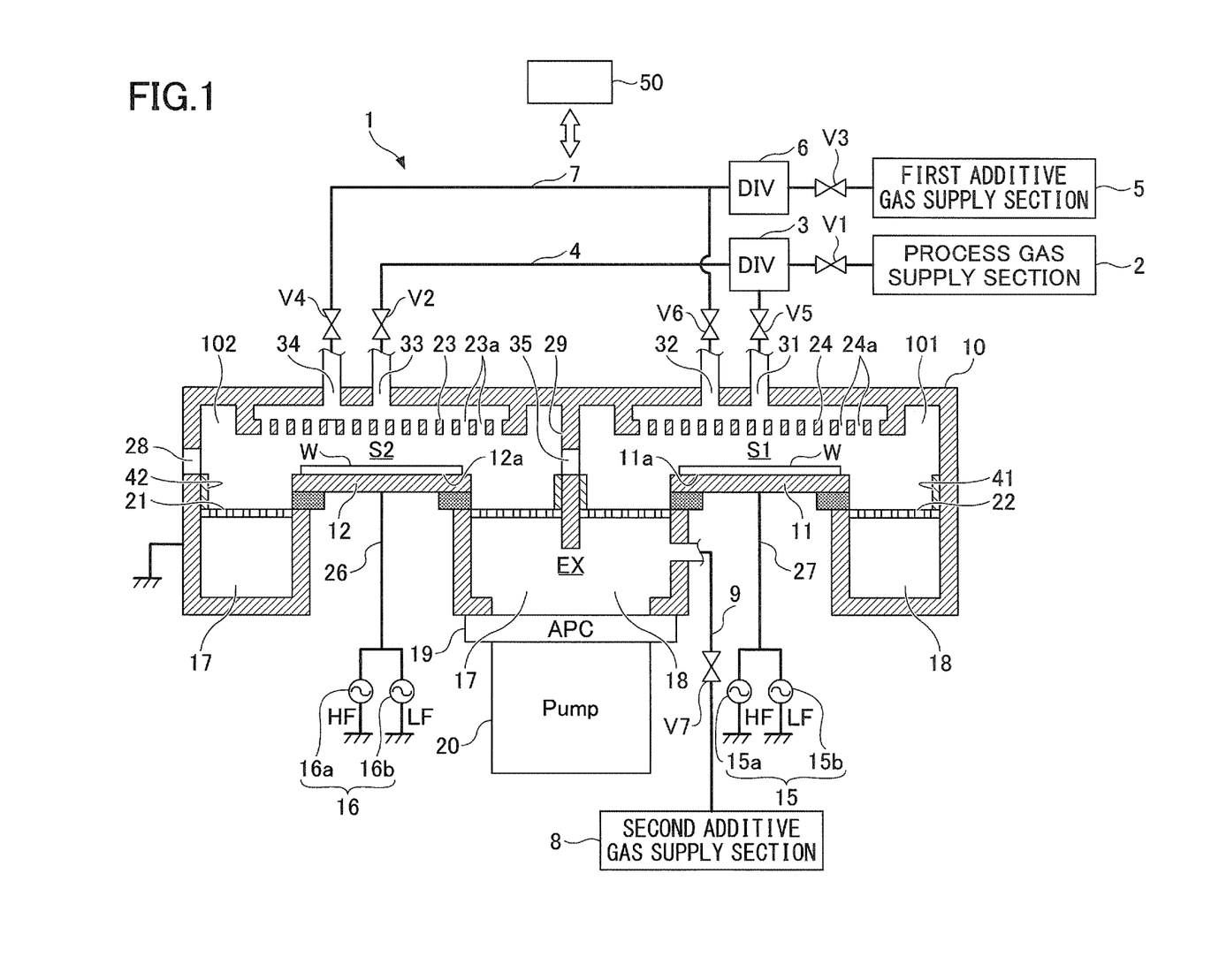
FIG. 1 is a cross-sectional view illustrating an example of a plasma processing apparatus according to an embodiment.
Figure 2:
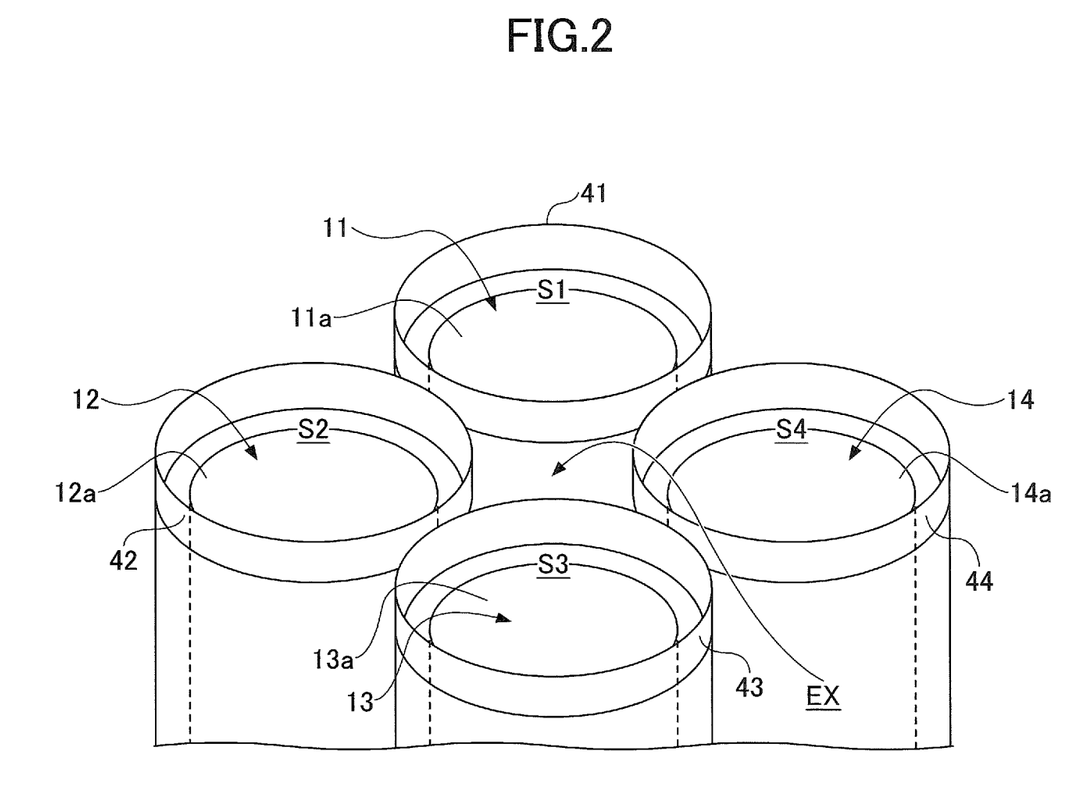
FIG. 2 is a drawing illustrating an example of multiple plasma processing chambers and an exhaust space according to the embodiment.

A plasma processing apparatus 1 according to the embodiment will be described with reference to FIG. 1 and FIG. 2. FIG. 1 is a cross-sectional view illustrating an example of the plasma processing apparatus 1 according to the embodiment. FIG. 2 is a drawing illustrating an example of multiple plasma processing chambers and an exhaust space according to the embodiment.

The plasma processing apparatus 1 of FIG. 1 is an example of an apparatus that can perform plasma processing on multiple substrates (e.g., semiconductor wafers) at the same time. The plasma processing apparatus 1 includes a cylindrical chamber 10, for example, made of aluminum, the surface of which is anodized. The chamber 10 is grounded.

The space inside of the chamber 10 is separated into four plasma processing chambers S1, S2, S3, and S4 by cylindrical deposit shields 41, 42, 43, and 44 and stages 11, 12, 13, and 14 on which the substrates W are mounted, illustrated in FIG. 2. The substrate W can be mounted on a mounting surface 11a of the stage 11, a mounting surface 12a of the stage 12, a mounting surface 13a of the stage 13, and a mounting surface 14a of the stage 14. During the substrate processing, four substrates W may be mounted on all of the mounting surfaces 11a to 14a, or less than four substrates W may be mounted on at least one or more of the mounting surfaces 11a to 14a.

The cylindrical deposit shields 41 to 44 are adjacent and have an exhaust space EX in the center of the cylindrical deposit shields 41 to 44. Multiple plasma processing chambers S1 to S4 share the exhaust space EX. That is, the plasma processing chambers S1 to S4 communicate with each other through the exhaust space EX, and the gases in the plasma processing chambers S1 to S4 are exhausted through the exhaust space EX.

In the example of FIG. 1, the two plasma processing chambers S1, S2 among the four plasma processing chambers are formed by the deposit shields 41 and 42 covering the side wall and central wall 29 of the cylindrical chamber 10. The four plasma processing chambers can process four substrates W at the same time. However, the number of plasma processing chambers is not limited to four. The two plasma processing chambers S1 and S2 and the remaining two plasma processing chambers have the same structure and function. Thus, the configuration of the two plasma processing chambers S1 and S2 is generally described, and the description of the configuration of the other two plasma processing chambers may be omitted.

In spaces 101 and 102 under the top walls of the plasma processing chambers S1 and S2 of the chamber 10, gas showerheads 24 and 23 opposite to the stages 11 and 12 are provided for introducing a gas for the plasma processing (hereinafter referred to as the "process gas") into the chamber 10. The process gas is supplied to the gas showerheads 24 and 23 from a process gas supply line 4 connected to gas inlets 31 and 33. The process gas supply line 4 supplies the process gas to each of the multiple plasma processing chambers.

The process gas supply line 4 is connected to a process gas supply section 2 and introduces the process gas from the process gas supply section 2 to the process gas supply line 4. The process gas is diverted by a diverter 3 and is introduced into the plasma processing chambers S1 and S2 in a shower from a number of gas discharge holes 23a and 24a provided on lower surfaces of the gas showerheads 23 and 24. Although not illustrated in FIG. 1, the process gas is diverted by the diverter 3 and can be introduced into the plasma processing chambers S3 and S4.

A valve V1 is connected to the process gas supply line 4 at the upstream side of the diverter 3, and valves V2 and V5 are connected at the downstream side of the diverter 3. Valves, which are not illustrated, may also be connected to the process gas supply line 4 between the diverter 3 and the gas inlets of the plasma processing chambers S3 and S4. The valve V1 controls the supply and stop of the process gas before being diverted, and the valves V2, V5, and so on individually control the supply and stop of the process gases supplied to the plasma processing chambers S1 to S4 after being diverted. Further, a mass flow controller (MFC), which is not illustrated, is connected to the process gas supply line 4 at the upstream side of the diverter 3 to control the flow rate of the process gas from the process gas supply section 2.

In addition, an additive gas may be supplied to the gas showerheads 24 and 23 from a first additive gas supply line 7 connected to the gas inlets 32 and 34. The first additive gas supply line 7 can supply the additive gas to each of the multiple plasma processing chambers.

The first additive gas supply line 7 is connected to a first additive gas supply section 5, and the additive gas is introduced from the first additive gas supply section 5 to the first additive gas supply line 7. The additive gas is diverted by a diverter 6 and is introduced into the plasma processing chambers S1 and S2 as a shower from a number of gas discharge holes 23a and 24a provided on the lower surface of the gas showerheads 23 and 24. Here, although not illustrated in FIG. 1, the additive gas can be diverted by the diverter 6 and also can be introduced into the plasma processing chambers S3 and S4.

A valve V3 is connected to the first additive gas supply line 7 at the upstream side of the diverter 6, and valves V4 and V6 are connected at the downstream side of the diverter 6. Valves, which are not illustrated, may also be connected to the first additive gas supply line 7 between the diverter 6 and the gas inlets of the plasma processing chambers S3 and S4. The valve V3 controls the supply and stop of the additive gas before being diverted, and the valves V4, V6, and so on individually control the supply and stop of the additive gases supplied to the plasma processing chambers S1 to S4 after being diverted. Further, a mass flow control device (MFC), which is not illustrated, is connected to the first additive gas supply line 7 at the upstream side of the diverter 6 to control the flow rate of the additive gas from the first additive gas supply section 5. This enables a predetermined flow rate of the additive gas to be supplied to each of the plasma processing chambers S1 to S4.

The additive gas is supplied to the exhaust space EX from the second additive gas supply line 9. The second additive gas supply line 9 is connected to the second additive gas supply section 8 and the additive gas is introduced from the second additive gas supply section 8 to the second additive gas supply line 9 and the additive gas is directly supplied to the exhaust space EX. A valve V7 is connected to the second additive gas supply line 9 and the valve V7 controls the supply and stop of the additive gas supplied to the exhaust space EX. Further, a mass flow control device (MFC), which is not illustrated, is connected to the second additive gas supply line 9 to control the flow rate of the additive gas from the second additive gas supply section 8. This enables a predetermined flow rate of the additive gas to be supplied to the exhaust space EX under baffle plates 21 and 22.

Here, the gas line that supplies the additive gas may include at least either the first additive gas supply line 7 or the second additive gas supply line 9.

Power feeding rods 27 and 26 are respectively connected to the stages 11 and 12, and an RF power supply 15 and an RF power supply 16 are respectively connected via a matching circuit, which is not illustrated. The RF power supply 15 and the RF power supply 16 respectively supply the high-frequency power HF to the stages 11 and 12, so that plasmas of the process gas are generated in the plasma processing chambers S1 and S2, and etching or the like is performed on the substrate W by the plasma.

Here, the RF power supply 15 and the RF power supply 16 may respectively apply predetermined high-frequency power HF to the stages 11 and 12 that function as lower electrodes or to the gas showerheads 23 and 24 that function as upper electrodes.

The RF power supply 15 includes an HF power supply 15a and further includes an LF power supply 15b for bias voltage. However, the RF power supply 15 may not be required to include the LF power supply 15b. The RF power supply 16 includes an HF power supply 16a for plasma generation and further includes an LF power supply 16b for bias voltage. However, the RF power supply 16 may not be required to include the LF power supply 16b. The HF power supply 15a outputs the high-frequency power HF for plasma generation. The LF power supply 15b outputs the high-frequency power LF for bias voltage. Likewise, the HF power supply 16a outputs the high-frequency power HF for plasma generation. The LF power supply 16b outputs the high-frequency power LF for bias voltage. The frequency of the high-frequency power LF output from the LF power supply 15b and the LF power supply 16b is lower than the frequency of the high-frequency power HF output from the HF power supply 15a and the HF power supply 16a.

On the side wall of the chamber 10, a transfer port 28 for transferring the substrate W from the outside and into the chamber is provided. On the central wall 29 for separating the multiple plasma processing chambers, a transfer port 35 for transferring the substrate W between the plasma processing chambers is provided. Below the stages 11 and 12, an atmospheric space is formed, the RF power supplies 15 and 16, the power feeding rods 27 and 26 are disposed, and a pipe for cooling gas that controls the temperature of the substrate W and a pipe for refrigerant are disposed.

The circular baffle plates 21 and 22 are provided between the side walls of the chamber 10 and the stages 11 and 12. The baffle plates 21 and 22 are, for example, constituted by forming a film having corrosion resistant (a film of yttrium oxide or the like) on a surface of a base metal formed of aluminum. Multiple through-holes are formed in the baffle plates 21 and 22.

Under the baffle plates 21 and 22, exhaust spaces 17 and 18 are annularly formed in a circumferential direction on the outer circumferential side of the substrate W. The exhaust spaces 17 and 18 form the exhaust space EX shared among the four plasma processing chambers including the plasma processing chambers S1 and S2 at the center of the bottom of the chamber 10.

Under the baffle plates 21 and 22 and on the bottom of the center of the chamber 10, an exhaust port connecting to the exhaust space EX is provided. An exhaust device 20 is connected to the exhaust port via an adaptive pressure control (APC) 19. The exhaust device 20 is an exhaust device shared among the multiple plasma processing chambers S1 to S4 and includes a vacuum pump such as a dry pump and a turbomolecular pump.

The APC 19 is a controller that can control pressure by controlling regulating valves. The exhaust device 20 performs roughing pumping in the chamber 10 through the exhaust space EX by a dry pump and then evacuates the chamber 10 by a turbomolecular pump, for example. The APC 19 and the exhaust device 20 are an example of an exhaust section communicating with the exhaust space EX. The exhaust section may not be required to include the APC 19. The exhaust device 20 exhausts gases in the four plasma processing chambers including the plasma processing chambers S1 and S2 through the exhaust space EX.

The controller 50 controls the entire operation of the plasma processing apparatus 1. The controller 50 includes a central processing unit (CPU) and a memory such as a read only memory (ROM) and a random access memory (RAM). The CPU performs predetermined processing such as etching on the substrate W according to a recipe stored in the memory. The process time, the pressure (gas exhaust), the high-frequency power and voltage, the flow rates of various gases, the temperature in the chamber (the upper electrode temperature, the chamber side wall temperature, the substrate W temperature, the electrostatic chuck temperature, and the like), and the set temperature of the refrigerant, which are control information of the apparatus for a process condition, are set in the recipe. Here, the program and such a recipe representing the process condition may be stored on a hard disk drive or in a semiconductor memory. Additionally, the recipe may be stored in a portable computer-readable storage medium such as a CD-ROM, a DVD, or the like, the portable computer-readable storage medium may be set in a predetermined position, and the recipe may be read from the portable computer-readable storage medium.

[Etch Rate Imbalance]

In the plasma processing apparatus 1 of FIG. 1, etching characteristics such as the etch rate of the film on the substrates W change between when process gas is supplied, and four substrates W are etched at the same time in the plasma processing chambers S1 to S4; and when process gas is supplied, and less than four substrates W are etched at the same time. In these cases, the additive gas is not supplied from the first additive gas supply line 7 and the second additive gas supply line 9.

As illustrated in FIG. 2, a plasma space is divided into four spaces (the plasma processing chambers S1 to S4) over the stages 11 to 14 with the deposit shields 41 to 44. When viewed from the exhaust space EX of the gas, the exhaust system of the plasma processing chambers S1 to S4 has one gas space in common, and has a configuration in which the gases in the four plasma processing chambers S1 to S4 are exhausted from one gas space in the center by using one exhaust device 20. Thus, the flow of the gases from the four plasma processing chambers S1 to S4 toward the central exhaust space EX is formed.

As a result, it is conceivable that the characteristics of the etching applied to the substrates W change between when the four substrates W are etched at the same time and when less than four substrates W are etched at the same time.

Figure 3A:
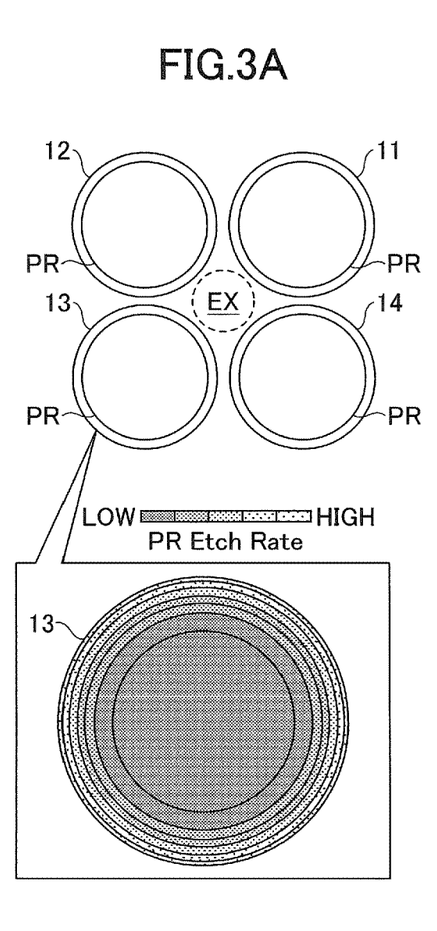
FIGS. 3A, 3B, and 3C are drawings each illustrating an example of an experimental result of an etch rate in accordance with the number of processed sheets.
Figure 3B:
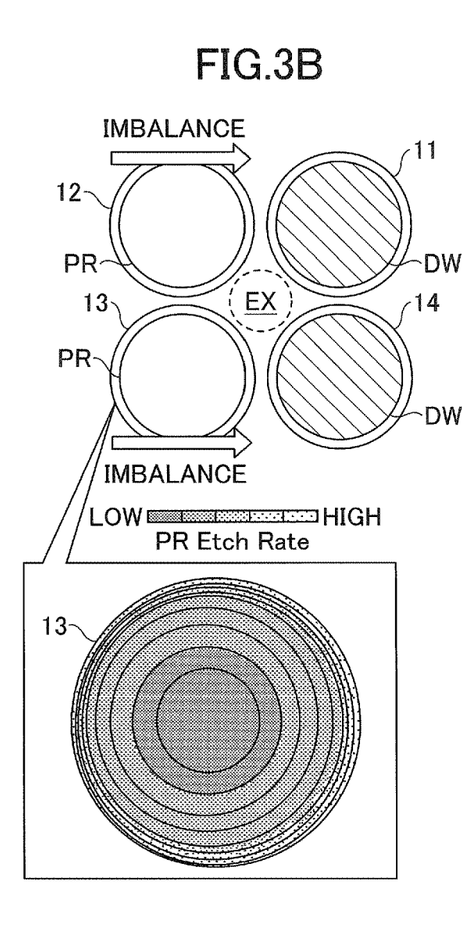
Figure 3C:
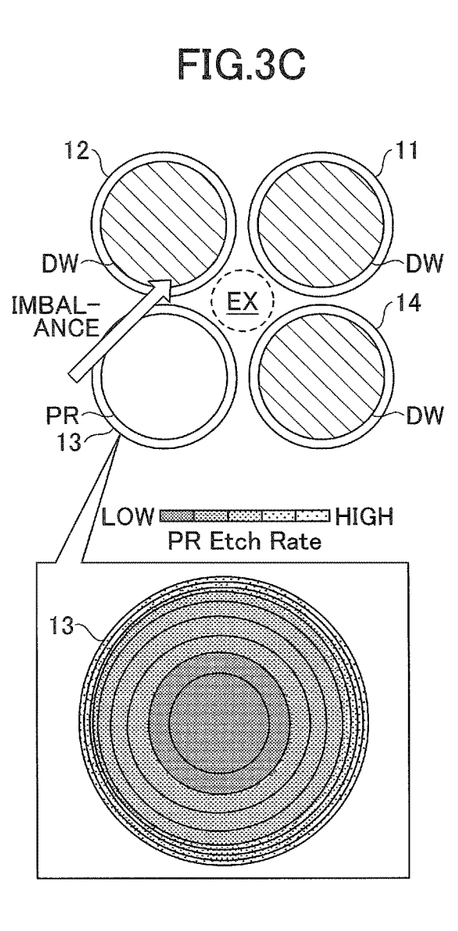

FIGS. 3A, 3B, and 3C are drawings each illustrating an example of an experimental result of the etch rate based on the number of the substrates W processed under a condition where the process gas is supplied and the additive gas is not supplied. In this experiment, oxygen gas was supplied as the process gas, and the high-frequency power HF for plasma generation and the high-frequency power LF for bias voltage were applied to each stage from the RF power supply to etch a resist film on the substrate W with an oxygen gas plasma. As the high-frequency power HF, a high-frequency continuous wave with a frequency of 100 MHz and a power of 1600 W was output. As a high-frequency power LF, a high-frequency continuous wave with a frequency of 13 MHz and a power of 100 W was output.

The upper view of FIG. 3A indicates a case in which the substrates W, on which resist films PR are formed, are mounted on the stages 11 to 14, and four substrates W are etched by an oxygen gas plasma. The lower view of FIG. 3A indicates the contours of the etch rate and how high the etch rate is for the resist film PR of the substrate W of the stage 13 among the four processed substrates W, as a result of the experiment in the condition of FIG. 3A. According to this, when four substrates W are etched at the same time, the contours of the etch rate become concentric, and there is no imbalance in the distribution of the etch rate on the substrate W.

The upper view of FIG. 3B indicates a case in which the substrates W, on which the resist films PR are formed, are mounted on the stages 12 and 13, dummy substrates DW of silicon are mounted on the stages 11 and 14, and the two substrates W mounted on the stages 12 and 13 are etched using an oxygen gas plasma. The lower view of FIG. 3B indicates the contours of the etch rate and how high the etch rate is for the resist film PR of the substrate W of the stage 13 among the two processed substrates W, as a result of the experiment in the condition of FIG. 3B above. Accordingly, if two substrates W are etched at the same time, the contours of the etch rate do not become concentric, there is an imbalance in the etch rate, and the etch rates are distributed such that the etch rate is high near the dummy substrate DW on the stage 14. The etch rate of the resist film PR of the substrate W of the stage 12 similarly becomes unbalanced such that the etch rate is high near the dummy substrate DW on the stage 11. Additionally, the average etch rate for the substrate W is higher than the average etch rate obtained when the four substrates W are etched.

The upper view of FIG. 3C indicates a case in which the substrate W, on which the resist film PR is formed, is mounted on the stage 13, the dummy substrates DW of silicon are mounted on the stages 11, 12, and 14, and the substrate W mounted on the stage 13 is etched by an oxygen gas plasma. The lower view of FIG. 3C indicates the contours of the etch rate and how high the etch rate is for the resist film PR of the substrate W of the stage 13, as a result of the experiment in the condition of FIG. 3C above. According to this, when one substrate W is etched, the contours of the etch rate do not become concentric, there is an imbalance in the etch rate, and the etch rates are distributed such that the etch rate is high near the dummy substrate DW on the stage 11. Additionally, the average etch rate for the substrate W is higher than the average etch rate obtained when the four substrates W are etched.

Figure 4:
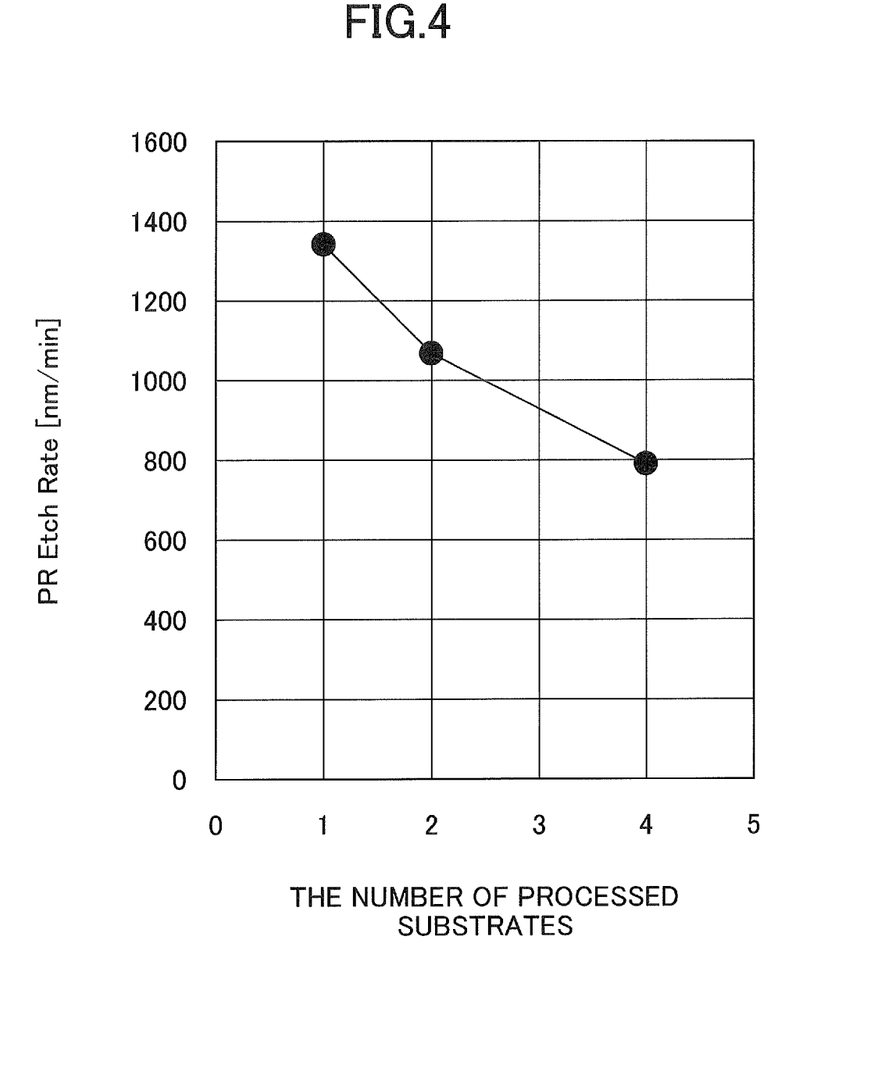
FIG. 4 is a graph illustrating an example of an experimental result of an etch rate in accordance with the number of processed sheets.

The results of the above-described experiments will continue to be explained with reference to FIG. 4. FIG. 4 is a graph illustrating the experimental results of the average value of the etch rate in accordance with the number of processed sheets. The horizontal axis of FIG. 4 indicates the number of substrates W that are processed at the same time, and the vertical axis indicates the average value of the etch rate for the resist film PR. As illustrated in FIG. 4, as the number of processed substrate W decreases, the average value of the etch rate increases, and it is found that the etch distribution becomes unbalanced.

The reason for this is considered to be the influence of a reaction product generated during etching of the resist film PR on the substrate W. For example, when the resist film PR is etched with an oxygen gas plasma, a reaction product such as CO is generated from the substrate W.

With respect to the above, no reaction product is generated from the dummy substrate DW. In addition, the plasma processing apparatus 1 is structured so that the gas and the reaction product in the plasma processing chambers S1 to S4 can travel between the plasma processing chambers through the exhaust space EX. Therefore, if the concentration of the reaction product differs between the plasma processing chambers S1 to S4, the reaction product is spread between a plasma processing chamber where the concentration of the reaction product is high and a plasma processing chamber where the concentration of the reaction product is low among the plasma processing chambers S1 to S4. Non-charged gases, such as an etching gas and the reaction product, are spread to the stages through the exhaust space EX, and the processing on the substrate W placed on a given stage is influenced. As a result, in the substrate W in which the resist film PR is etched, the reaction product is spread from a stage on which the substrate W, which generates the reaction product, is mounted, to a stage on which the dummy substrate DW, which does not generate the reaction product, is mounted. Consequently, it is found that the etch rate near the stage on which the dummy substrate DW is mounted becomes high. As described, it is considered that the imbalance of the etch rate is caused by the experiment because the concentration of the reaction product at the stage of the dummy substrate DW becomes low, and that the process gas and the reaction product are spread into stages through the exhaust space EX.

From the graph of FIG. 4, it is also found that as the number of the substrates W that are processed decreases at the same time, that is, as the number of the dummy substrates DW mounted in the stages increases, the generation of reaction products is reduced as a whole, so that the average value of the etch rate increases.

Further, an experiment was performed in which the oxygen gas with a high flow rate of, for example, about three times greater than the flow rate of the oxygen gas performed in the experiment illustrated in FIGS. 3A, 3B, 3C and 4 was supplied, and four substrates were etched at the same time and less than four substrates were etched at the same time with the other process conditions being the same. As a result of the experiment, if the oxygen gas is caused to flow at high flow rates, the concentration of the reaction product relative to the etching gas is reduced, and thus the influence of the change in etching characteristics due to the number of the substrates W processed at the same time is reduced. However, the change of the etch rate and the imbalance of the etch rate distribution in accordance with the number of the processed substrate W cannot be avoided.

Here, in the present experiment, the oxygen gas was supplied to a plasma processing chamber into which the dummy substrate DW was transferred under the conditions the same as the conditions of the plasma processing chamber into which the substrate W was transferred, and the high-frequency power HF and the high-frequency power LF were applied to produce a plasma of the oxygen gas.

Then, the experiment was performed under both conditions of a case in which the oxygen gas is not supplied to the plasma processing chamber in which the dummy substrate DW was transferred, and a case in which the oxygen gas is supplied but the continuous waves of the high-frequency power HF and LF are not applied (no plasma ignition). As a result, in both the case in which the plasma of the oxygen gas is generated only in the plasma processing chamber into which the substrate W is transferred and the case in which the oxygen gas is generated only in the plasma processing chamber into which the substrate W is transferred (no plasma ignition), a change in the etching characteristics in accordance with the number of the processed substrates W is observed. That is, the etch rate change and the etch rate distribution imbalance due to the number of the processed substrates W cannot be removed.

Here, in the above-described experiment, the high-frequency power HF for plasma generation and the high-frequency power LF for bias voltage are both applied with continuous waves, but the application of the continuous wave of the high-frequency power LF for bias voltage may not be required.

[Additive Gas]

In order to improve the above-described change and imbalance of the etch rate, the plasma processing apparatus 1 according to the present embodiment includes a first additive gas supply line 7 and a second additive gas supply line 9 in addition to the process gas supply line 4, as illustrated in FIG. 1, to supply the additive gas. In the following description, an example of supplying the additive gas from the first additive gas supply line 7 will be described. However, the additive gas may be supplied from at least either the first additive gas supply line 7 or the second additive gas supply line 9. Additionally, the plasma processing apparatus 1 according to the present embodiment may include at least either the first additive gas supply line 7 or the second additive gas supply line 9.

The first additive gas supply line 7 is connected to the first additive gas supply section 5, and the additive gas supplied from the first additive gas supply section 5 is diverted with the diverter 6 and can be introduced into the plasma processing chambers S1 to S4. In the present embodiment, the additive gas corresponding to the reaction product is supplied to the stage where the substrate W is not processed.

The additive gas corresponding to the reaction product is a gas containing atoms that may constitute the reaction product produced upon etching an etching target film on the substrate W. That is, the additive gas corresponding to the reaction product (also simply referred to as the additive gas) is a gas that forms the reaction product produced when the etching target film on the substrate W is etched by the plasma of the process gas. Because the reaction product changes in accordance with the type of the etching target film and/or the type of the process gas, the additive gas also changes in accordance with the type of the etching target film and/or the type of the process gas.

For example, if the resist film PR of the organic film containing C, H, and O is etched by the plasma of the oxygen-containing gas, the additive gas may be a CO gas, a $CO_2$ gas, a $CH_4$ gas, or the like. For example, if a silicon-containing film, such as an Si film or an $SiO_2$ film, is etched with a fluorine (F)-containing gas, the additive gas may be an $SiF_4$ gas. For example, when a silicon-containing film such as an Si film or an SiO2 film is etched with a chlorine (Cl)-containing gas, the additive gas may be an $SiCl_4$ gas or the like.

As described, by supplying the additive gas to the plasma processing chamber in which the substrate W is not processed, the inside of the plasma processing chamber in which the dummy substrate DW is transferred can be adjusted with the gas that is the same as the components of the film type of the etching target film on the substrate W and the reaction product generated when processing the substrate W in accordance with the type and flow rate of the additive gas. This allows the gas compositions in the plasma processing chambers S1 to S4 to be substantially the same. As a result, the substantially same etch rate distribution can be obtained, regardless of whether the four substrates W are etched at the same time, or when less than four substrates W are etched at the same time, in the plasma processing chambers S1 to S4.

Here, the process gas is supplied to the plasma processing chamber in which the substrate W is etched, and the additive gas is not supplied. To the plasma processing chamber in which the substrate W is not etched, the additive gas and the process gas may be supplied, or only the additive gas may be supplied. If only the additive gas is supplied to the plasma processing chamber in which the substrate W is not etched, the flow rate of the process gas can be reduced and the cost can be reduced.

In the plasma processing chamber in which the substrate W is not etched, the dummy substrate DW may or may not be mounted on the stage. However, mounting the dummy substrate DW on the stage prevents the stage from being exposed to the plasma and prevents degradation of the stage.

[Plasma Processing Method]

Figure 5:
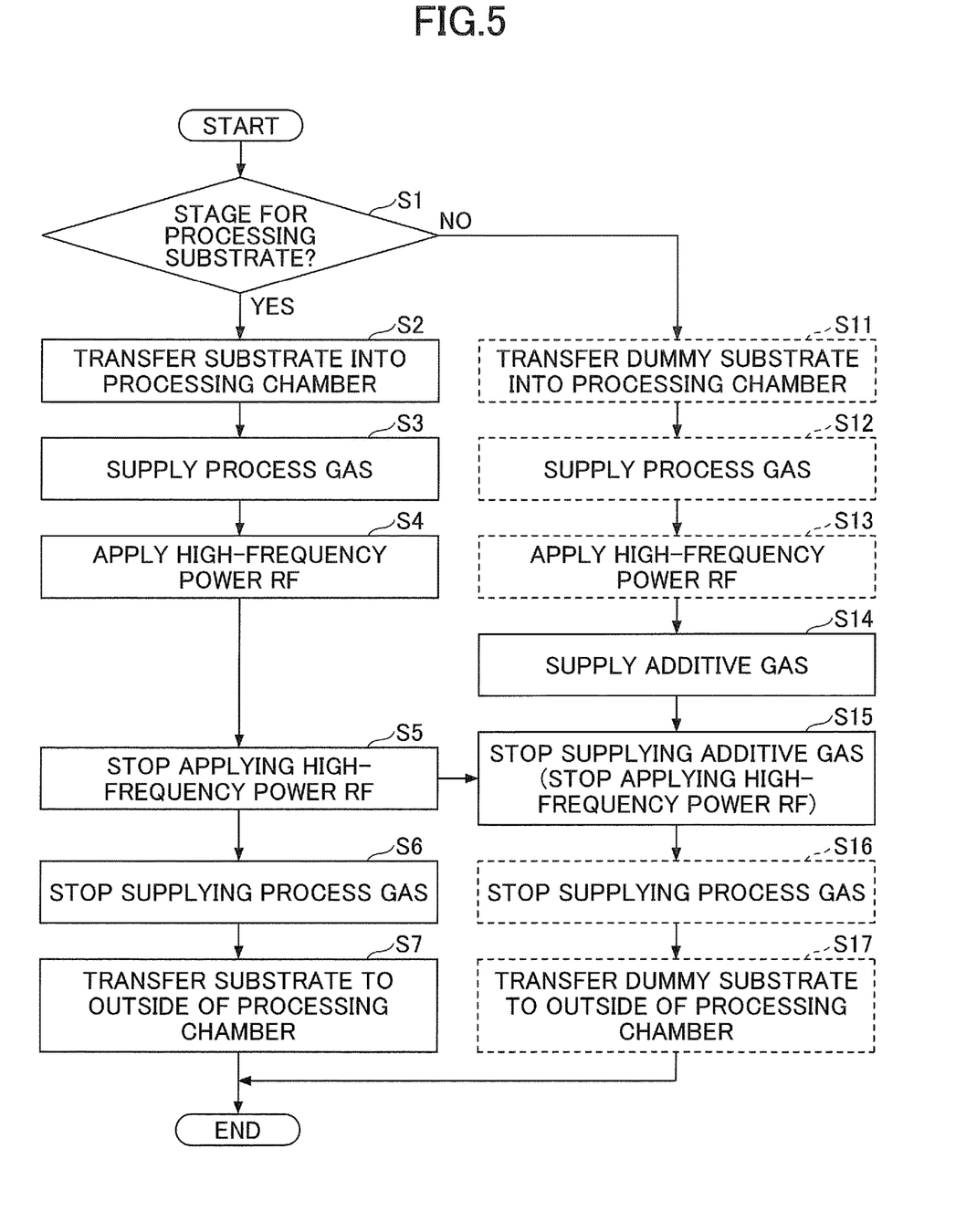
FIG. 5 is a flowchart illustrating Example 1 of a plasma processing method according to the embodiment.
Figure 6:
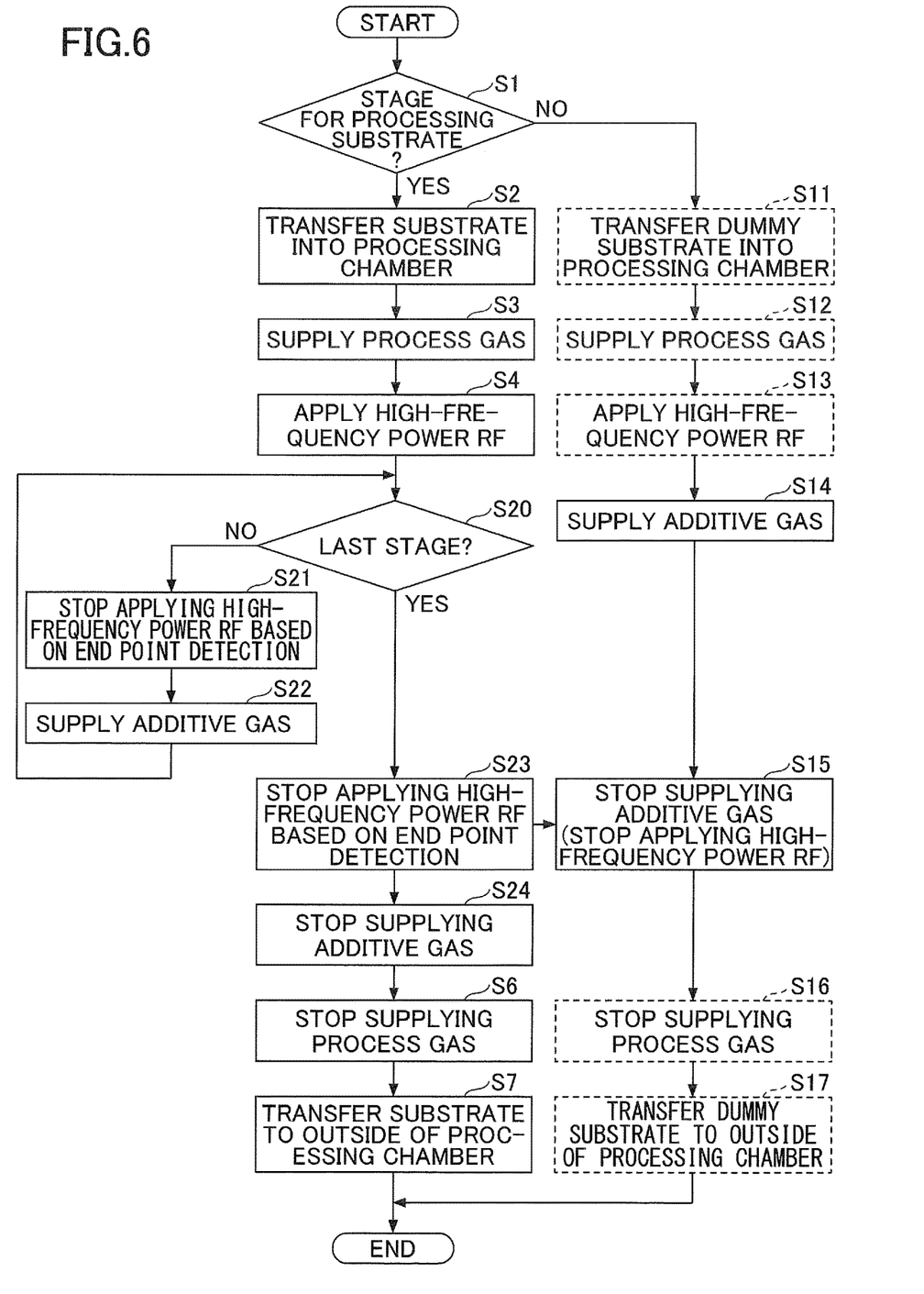
FIG. 6 is a flowchart illustrating Example 2 of a plasma processing method according to the embodiment.

Next, Examples 1 and 2 of the plasma processing method according to the embodiment will be described with reference to FIG. 5 and FIG. 6. FIG. 5 is a flowchart illustrating Example 1 of the plasma processing method according to the embodiment. FIG. 6 is a flowchart illustrating Example 2 of the plasma processing method according to the embodiment. Both of Examples 1 and 2 are performed by the plasma processing apparatus 1 according to the present embodiment and controlled by the controller 50.

Example 1

First, Example 1 of the plasma processing method according to the embodiment will be described with reference to FIG. 5. In the following, one or more plasma processing chambers into which the substrates W are transferred and subjected to plasma processing, among the multiple plasma processing chambers, are referred to as a "first plasma processing chamber group". One or more plasma processing chambers in which the substrates W are not transferred and subjected to plasma processing, among the multiple plasma processing chambers, are referred to as a "second plasma processing chamber group". Here, in FIG. 5, a step represented by a dashed line is a process that can be skipped. That is, the steps S11 to S13, S16, and S17 of FIG. 5 are processes that can be executed or may not be required to be performed by the controller 50. For example, the controller 50 may perform the process in step S11 and transfer the dummy substrate DW into the second plasma processing chamber group, or may skip the process in step S11 and be not required to transfer the dummy substrate DW into the second plasma processing chamber group.

When the present process is started, the controller 50 determines whether the stage is a stage for processing the substrate (step S1). The controller 50 may determine whether the stage is a stage for processing the substrate W, based on a recipe or by using other publicly-known methods. As a result of the determination, the plasma processing chamber (stage) in which the substrate W is processed is included in the first plasma processing chamber group, and the plasma processing chamber (stage) in which the substrate W is not processed is included in the second plasma processing chamber group, so that the controller 50 determines the first plasma processing chamber group and the second plasma processing chamber group.

Next, the controller 50 transfers the substrate W into the plasma processing chamber of the first plasma processing chamber group (step S2) and transfers the dummy substrate DW into the plasma processing chamber of the second plasma processing chamber group (step S11). Subsequent to step S2, the controller 50 supplies the process gas from the process gas supply line 4 to the plasma processing chamber of the first plasma processing chamber group (step S3) and applies the high-frequency power RF (RF power) (step S4). For example, the high-frequency power RF is the high-frequency power HF. This causes the plasma to ignite in the plasma processing chamber of the first plasma processing chamber group, the plasma of the process gas to be generated, and the substrate W to be processed with the plasma. Additionally, the high-frequency power RF may be the high-frequency power LF.

Subsequent to step S11, the controller 50 supplies the process gas to the plasma processing chamber of the second plasma processing chamber group (step S12) and applies the high-frequency power RF (step S13). Next, the controller 50 supplies the additive gas from the first additive gas supply line 7 to the plasma processing chamber of the second plasma processing chamber group (step S14).

The additive gas is supplied at the timing when the plasma is ignited in the plasma processing chamber of the first plasma processing chamber into which the substrate W is transferred, the substrate W is processed with the plasma of the process gas, and the reaction product generated. This is because if the additive gas is supplied at the same time when the process gas is supplied, the additive gas may flow into another plasma processing chamber from one plasma processing chamber in which the additive gas is supplied through the exhaust space EX before the reaction product is generated in the plasma processing chamber of the first plasma processing chamber group, and thus the etching of the substrate W may be influenced. Consequently, the supply timing of the additive gas is shifted from the supply timing of the process gas and is after the supply timing of the process gas. However, the supply timing of the additive gas is not limited to the timing after the supply timing of the process gas, and the additive gas may be supplied at approximately the same timing as the supply timing of the process gas.

The additive gas is supplied while the high-frequency power RF is supplied. This allows the additive gas to be decomposed by the high-frequency power RF to produce a gas having the same composition as the reaction product in the plasma processing chamber in which the substrate W is not processed.

In the plasma processing chamber of the first plasma processing chamber group in which the substrate W is transferred, after the plasma processing of the substrate W is completed, the application of the high-frequency power RF is stopped (step S5), the supply of the process gas is stopped (step S6), the substrate W is transferred to the outside of the plasma processing chamber (step S7), and the process ends.

In step S5, after the plasma processing of the substrate W is completed, the controller 50 stops supplying the additive gas in the plasma processing chamber of the second plasma processing chamber group in accordance with the timing when the application of the high-frequency power RF to the plasma processing chamber of the first plasma processing chamber group is stopped (step S15). If the high-frequency power RF is applied in step S13, the application of the high-frequency power RF is stopped (step S15). Next, the controller 50 stops supplying the process gas (step S16), transfers the dummy substrate W to the outside of the plasma processing chamber (step S17), and the process ends.

In the plasma processing method described above, no reaction product is generated from the plasma processing chamber when the application of the high-frequency power RF is stopped. Thus, there is a concern that depending on the timing when the application of the high-frequency power RF is stopped, the reaction product may spread to other plasma processing chambers, and thus the substrate process in other plasma processing chambers may be influenced.

With respect to the above, in the plasma processing apparatus 1 of FIG. 1, separate RF power supplies are respectively connected to the stages 11 to 14, and the application and the stop of the application of the high-frequency power RF can be independently controlled for each plasma processing chamber (stage). This can control the application and the stop of the application of the high-frequency power RF at an optimum timing for each plasma processing chamber. As a result, this can prevent the reaction product from spreading to other plasma processing chambers and influencing the substrate processing in other plasma processing chambers.

Example 2

Next, Example 2 of the plasma processing method according to the embodiment will be described with reference to FIG. 6. In FIG. 6, the steps represented by a dashed line are the processing that can be skipped. That is, the steps S11 to S13, S16, and S17 of FIG. 6 are the processing that the controller 50 may optionally perform.

When the present process starts, the controller 50 determines whether the stage is a stage for processing the substrate (step S1). The controller 50 may determine whether the stage is a stage for processing the substrate W, based on the recipe. As a result of the determination, the plasma processing chamber (stage) in which the substrate W is processed is included in the first plasma processing chamber group, the plasma processing chamber in which the substrate W is not processed is included in the second plasma processing chamber group, so that the controller 50 determines the first plasma processing chamber group and the second plasma processing chamber group.

Next, the controller 50 transfers the substrate W into the plasma processing chamber of the first plasma processing chamber group (step S2), supplies the process gas (step S3), and applies the high-frequency power RF (step S4). Additionally, the controller 50 transfers the dummy substrate DW into the plasma processing chamber of the second plasma processing chamber group (step S11), supplies the process gas (step S12), applies the high-frequency power RF (step S13), and supplies the additive gas (step S14). The supply timing of the additive gas is the same as the timing described in Example 1 of FIG. 5.

In multiple plasma processing chambers of the first group of plasma processing chambers, the timings of the completion of substrate processing may be shifted. Thus, subsequent to step S4, the controller 50 determines whether the plasma processing chamber is a plasma processing chamber (stage) in which the last substrate processing is to be performed among the plasma processing chambers of the first plasma processing chamber group (step S20). The controller 50 may determine whether the processing performed at the stage is the last substrate processing in the plasma processing chambers of the first plasma processing chamber group, based on a state of the application and the stop of the application of the high-frequency power RF to each plasma processing chamber of the first plasma processing chamber group. If the application of high-frequency power RF to all other plasma processing chambers of the first plasma processing chambers group is stopped, it can be determined that the processing performed at the stage is the last substrate processing.

In step S20, if it is determined that the plasma processing chamber is not a plasma processing chamber in which the last substrate processing is performed, the controller 50 proceeds to step S21, and when an end point of the etching target film is detected, the controller 50 stops applying the high-frequency power RF to the plasma processing chamber. The amount of the reaction product generated in each plasma processing chamber can be determined by monitoring the emission intensity in the chamber 10 of the plasma processing apparatus 1. Thus, the controller 50 detects the end point of the etching target film and stops applying the high-frequency power RF to the plasma processing chamber when it is determined that no reaction product is generated or the amount of the reaction product generated is greatly reduced, based on the emission intensity in the chamber 10.

At this time, it is determined in step S20 that the plasma processing chamber is not a plasma processing chamber in which the last substrate processing is performed, and thus the etching continues in at least one of the plasma processing chambers of the first plasma processing chamber group that are other than the plasma processing chamber. Therefore, the controller 50 supplies the additive gas from the first additive gas supply line 7 to the plasma processing chamber that is determined not to be a plasma processing chamber in which the last substrate process is performed in the plasma processing chambers of the first plasma processing chamber group (step S22).

This provides the additive gas to not only the plasma processing chamber of the second plasma processing chamber group in which the substrate W is not processed, but also the plasma processing chamber of the first plasma processing chamber group in which the substrate W is processed. As a result, the inside of the plasma processing chamber of the first plasma processing chamber in which the processing of the substrate W has been completed can be adjusted so that the components are the same as the reaction product generated in accordance with the type and the flow rate of the additive gas when processing the substrate W. This allows the gas compositions in the plasma processing chambers S1 to S4 to be substantially the same. As a result, when the four substrates W are etched at the same time in the plasma processing chambers S1 to S4, and when the less than four substrates W are etched at the same time, there is no change in the etching characteristics, and the same etch rate distribution can be obtained.

After the process in step S22, the process returns to step S20, and the controller 50 repeats the process in steps S20 to S22 while determining that the plasma processing chamber is not a plasma processing chamber in which the last substrate processing is performed among the plasma processing chambers of the first plasma processing chamber group.

In step S20, if it is determined that the plasma processing chamber is a plasma processing chamber in which the last substrate processing is performed, the controller 50 proceeds to step S23, and when the end point of the etching target film is detected, the controller 50 stops applying the high-frequency power RF to the plasma processing chamber. Then, the controller 50 stops supplying the additive gas to the plasma processing chamber to which the additive gas is supplied in the first plasma processing chamber group (step S24), stops supplying the process gas (step S6), transfers the substrate W to the outside of the plasma processing chamber (step S7), and the present process ends.

The control of each plasma processing chamber of the second plasma processing chamber group indicated in steps S11 to S17 is substantially the same as that of Example 1 illustrated in FIG. 5, and thus the description will be omitted here.

In Examples 1 and 2, as described above, the controller 50 may supply the process gas from the process gas supply line 4 to the plasma processing chamber of the first plasma processing chamber group and to the plasma processing chamber of the second plasma processing chamber group.

In Examples 1 and 2, the controller 50 may supply the process gas from the process gas supply line 4 to the plasma processing chamber of the first plasma processing chamber group and may not be required to supply the process gas to the plasma processing chamber of the second plasma processing chamber group.

In Examples 1 and 2, the controller 50 may supply the additive gas to the plasma processing chamber of the second plasma processing chamber group at the same timing or after the timing of supplying the process gas to the plasma processing chamber of the first plasma processing chamber group and/or a plasma processing chamber of the second plasma processing chamber group.

In Examples 1 and 2, the additive gas may be supplied directly to the exhaust space EX from the second additive gas supply line 9. By supplying the additive gas directly to the exhaust space EX, the diverter 6 connected to the first additive gas supply line 7 can be omitted, and thus the cost can be reduced. If the additive gas is supplied directly to the exhaust space EX, the timing of the additive gas supply may be any time. That is, the controller 50 may supply the additive gas to a plasma processing chamber of the second plasma processing chamber group and/or the exhaust space EX at the same timing or after the timing of supplying the process gas to the plasma processing chamber of the first plasma processing chamber and/or the plasma processing chamber of the second plasma processing chamber group. However, it is preferable that the timing of supplying the additive gas to the exhaust space EX corresponds to the timing of introducing the reaction product into the exhaust space EX. The additive gas may be supplied to the exhaust space EX from the second additive gas supply line 9 while the additive gas is supplied to the plasma processing chamber of the second plasma processing chamber group from the first additive gas supply line 7.

In Example 2, if the etching target films are laminated, the processes in steps S21 to S22 of FIG. 6 is repeated for each of the different laminated films. In this case, the high-frequency power RF is not stopped in step S21 while the processing in step S21 to step S22 is repeatedly performed. Then, when it is determined by the endpoint detection that an upper film of the laminated film is etched, the additive gas is changed in accordance with the reaction product generated by the process gas for etching a lower film and the additive gas is supplied in step S22. When the etching target film is changed to the lower layer, the process gas is changed accordingly and supplied.

As described above, when the etching target films are laminated, by changing the type of the additive gas when the type of the film changes, an appropriate additive gas can be supplied corresponding to a change in the reaction product generated in accordance with the type of the etching target film that is currently etched and the type of the process gas.

That is, if the etching target films are laminated, the controller 50 can detect the end point of each etching target film of the laminated films and change the type of the additive gas in accordance with a result of the endpoint detection.

As described above, according to the plasma processing apparatus and the plasma processing method according to the present embodiment, uniform substrate processing can be performed regardless of the number of substrates that are processed in multiple plasma processing chambers that share an exhaust space.

The plasma processing apparatus and the plasma processing method according to the embodiment disclosed herein are to be considered as examples in all respects and not restrictive. Changes and improvements of the embodiment in various forms can be made without departing from the appended claims and the subject matter thereof. The configurations of the above-described features may be modified as long as there is no inconsistency, and may be combined as long as there is no inconsistency.

The plasma processing apparatus according to the present disclosure is applicable not only to capacitively coupled plasma (CCP), but also to any device among atomic layer deposition (ALD) devices, inductively coupled plasma (ICP), radial line slot antenna (RLSA), electron cyclotron resonance plasma (ECR), and helicon wave plasma (HWP).

The plasma processing apparatus can be applied not only to a device that performs etching, but also to a device that performs predetermined processing on a substrate, such as film deposition, asking, sputtering, or the like.

The plasma processing apparatus may also include separate gas paths on the center side and the edge side of the gas showerheads 23 and 24 to control the flow rate of the additive gas for each zone of the center and edge zones.

According to at least one embodiment of the present disclosure, uniform substrate processing can be performed regardless of the number of substrates processed in multiple plasma processing chambers that share an exhaust space.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
a plurality of plasma processing chambers;

a process gas supply line configured to supply a plasma processing gas to each of the plurality of plasma processing chambers;
a first additive gas supply line configured to supply an additive gas to each of the plurality of plasma processing chambers;
an exhaust space shared by the plurality of plasma processing chambers; and
a controller,
wherein the controller determines a first plasma processing chamber group and a second plasma processing chamber group, the first plasma processing chamber group including one or more plasma processing chambers, each of which performs the plasma processing on a substrate, among the plurality of plasma processing chambers, and the second plasma processing chamber group including one or more plasma processing chambers, each of which does not perform the plasma processing on a substrate, among the plurality of plasma processing chambers, and
wherein the controller causes the additive gas to be supplied to the one or more plasma processing chambers of the second plasma processing chamber group from the first additive gas supply line.

2. The plasma processing apparatus as claimed in claim 1, wherein the controller supplies the gas for the plasma processing to the one or more plasma processing chambers of the first plasma processing chamber group from the process gas supply line.

3. The plasma processing apparatus as claimed in claim 2, wherein the controller supplies the gas for the plasma processing to the one or more plasma processing chambers of the second plasma processing chamber group from the process gas supply line.

4. The plasma processing apparatus as claimed in claim 2, wherein the controller supplies the additive gas to at least either the one or more plasma processing chambers of the second plasma processing chamber group or the exhaust space at a same timing as a process gas supply timing or after the process gas supply timing, the process gas supply timing being when the gas for the plasma processing is supplied to at least either the one or more plasma processing chambers of the first plasma processing chamber group or the one or more plasma processing chambers of the second plasma processing chamber group.

5. The plasma processing apparatus as claimed in claim 1, further comprising an exhaust device disposed in the exhaust space, the exhaust device being shared among the plurality of plasma processing chambers.

6. The plasma processing apparatus as claimed in claim 1, wherein a dummy substrate is mounted in each of the one or more plasma processing chambers of the second plasma processing chamber group.

7. The plasma processing apparatus as claimed in claim 1, wherein the additive gas forms a reaction product that is generated when an etching target film on the substrate is etched by plasma of the gas for the plasma processing.

8. The plasma processing apparatus as claimed in claim 7, wherein the controller supplies the additive gas at a timing when application of high-frequency power to a plasma processing chamber is stopped, the plasma processing chamber being other than a plasma processing chamber in which a process for the substrate is to be completed last among the one or more plasma processing chambers of the first plasma processing chamber group.

9. The plasma processing apparatus as claimed in claim 1, wherein the controller supplies at least one of a CO gas, a $CO_2$ gas, or a $CH_4$ gas, as the additive gas, in a case where an etching target film on the substrate is a resist film of an organic film and the etching target film is etched by plasma of an oxygen-containing gas.

10. The plasma processing apparatus as claimed in claim 1, wherein the controller supplies an $SiF_4$ gas as the additive gas, in a case where an etching target film on the substrate is a silicon-containing film and the etching target film is etched by plasma of a fluorine-containing gas.

11. The plasma processing apparatus as claimed in claim 1, wherein the controller supplies an $SiCl_4$ gas as the additive gas, in a case where an etching target film on the substrate is a silicon-containing film and the etching target film is etched by plasma of a chlorine-containing gas.

12. A plasma processing apparatus comprising:
a plurality of plasma processing chambers;
a process gas supply line configured to supply a plasma processing gas to each of the plurality of plasma processing chambers;
an exhaust space shared by the plurality of plasma processing chambers;
a second additive gas supply line configured to supply an additive gas to the exhaust space; and
a controller,
wherein the controller determines a first plasma processing chamber group and a second plasma processing chamber group, the first plasma processing chamber group including one or more plasma processing chambers, each of which performs the plasma processing on a substrate, among the plurality of plasma processing chambers, and the second plasma processing chamber group including one or more plasma processing chambers, each of which does not perform the plasma processing on a substrate, among the plurality of plasma processing chambers, and
wherein the controller causes the additive gas to be supplied to the exhaust space from the second additive gas supply line.

13. A plasma processing method performed by a plasma processing apparatus including a plurality of plasma processing chambers, a process gas supply line configured to supply a plasma processing gas to each of the plurality of plasma processing chambers, a first additive gas supply line configured to supply an additive gas to each of the plurality of plasma processing chambers, and an exhaust space shared by the plurality of plasma processing chambers, the plasma processing method comprising:
determining a first plasma processing chamber group and a second plasma processing chamber group, the first plasma processing chamber group including one or more plasma processing chambers, each of which performs the plasma processing on a substrate, among the plurality of plasma processing chambers, and the second plasma processing chamber group including one or more plasma processing chambers, each of which does not perform the plasma processing on a substrate, among the plurality of plasma processing chambers, and
causing the additive gas to be supplied to the one or more plasma processing chambers of the second plasma processing chamber group from the first additive gas supply line.

14. The plasma processing method as claimed in claim 13, wherein the plasma processing method further comprises supplying the gas for the plasma processing to the one or more plasma processing chambers of the first plasma processing chamber group from the process gas supply line.

15. The plasma processing method as claimed in claim 14, wherein the plasma processing method further comprises supplying the gas for the plasma processing to the one or more plasma processing chambers of the second plasma processing chamber group from the process gas supply line.

16. The plasma processing method as claimed in claim 14, wherein the plasma processing method further comprising supplying the additive gas to at least either the one or more plasma processing chambers of the second plasma processing chamber group or the exhaust space at a same timing as a process gas supply timing or after the process gas supply timing, the process gas supply timing being when the gas for the plasma processing is supplied to at least either the one or more plasma processing chambers of the first plasma processing chamber group or the one or more plasma processing chambers of the second plasma processing chamber group.

17. The plasma processing method as claimed in claim 16, wherein the plasma processing method further comprises changing, in a case where etching target films are laminated on the substrate, a type of the additive gas for each of the etching target films, upon detecting an end point of a corresponding etching target film of the etching target films, based on a result of the detecting of the end point.

18. A plasma processing method performed by a plasma processing apparatus including a plurality of plasma processing chambers, a process gas supply line configured to supply a plasma processing gas to each of the plurality of plasma processing chambers, an exhaust space shared by the plurality of plasma processing chambers, a second additive gas supply line configured to supply an additive gas to the exhaust space, the plasma processing method comprising:

determining a first plasma processing chamber group and a second plasma processing chamber group, the first plasma processing chamber group including one or more plasma processing chambers, each of which performs the plasma processing on a substrate, among the plurality of plasma processing chambers, and the second plasma processing chamber group including one or more plasma processing chambers, each of which does not perform the plasma processing on a substrate, among the plurality of plasma processing chambers, and causing the additive gas to be supplied to the exhaust space from the second additive gas supply line.

* * * * *